United States Patent
Wong

[54] INTEGRATED CIRCUIT CAPACITOR

[75] Inventor: Ting-wah Wong, Cupertino, Calif.

[73] Assignee: Programmable Silicon Solutions, Sunnyvale, Calif.

[21] Appl. No.: 09/099,733

[22] Filed: Jun. 19, 1998

[51] Int. Cl.⁷ .................................. H01L 21/20
[52] U.S. Cl. ............................ 438/381; 438/391
[58] Field of Search .................... 438/383, 251, 438/253, 391, 386, 393, 394, 395, 250; 257/303, 306, 310

[56] References Cited

U.S. PATENT DOCUMENTS

| | | | |
|---|---|---|---|
| 3,975,220 | 8/1976 | Quinn et al. ............................ | 438/251 |
| 4,466,177 | 8/1984 | Chao ...................................... | 438/251 |
| 4,746,377 | 5/1988 | Kobayashi et al. ..................... | 438/393 |
| 5,006,480 | 4/1991 | Chang et al. ........................... | 438/251 |
| 5,168,075 | 12/1992 | Kuo ....................................... | 438/251 |
| 5,173,835 | 12/1992 | Cornett et al. ......................... | 257/310 |
| 5,753,559 | 5/1998 | Yew et al. .............................. | 438/398 |
| 5,861,651 | 1/1999 | Brasen et al. .......................... | 257/411 |
| 5,981,349 | 11/1999 | Hebert .................................... | 438/381 |

[11] Patent Number: 6,057,203
[45] Date of Patent: May 2, 2000

*Primary Examiner*—Wael Fahmy
*Assistant Examiner*—William David Coleman
*Attorney, Agent, or Firm*—Trop, Pruner & Hu, P.C.

[57] ABSTRACT

A capacitor may be formed by implanting after forming a dielectric and a conductive layer over a semiconductor structure. This diminishes the implant damage to the region underneath the conductive layer. Implanted impurities may be driven under the conductive layer such that two opposed impurity profiles overlap. This forms a junction under the conductive layer.

7 Claims, 2 Drawing Sheets

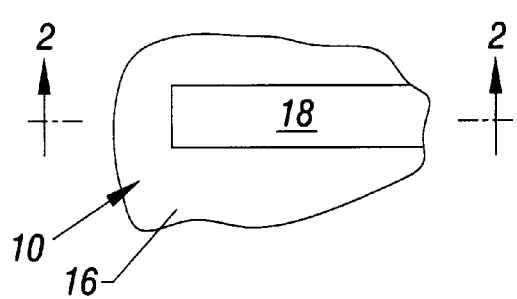
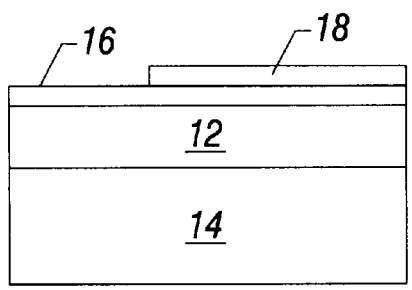
FIG. 1  FIG. 2
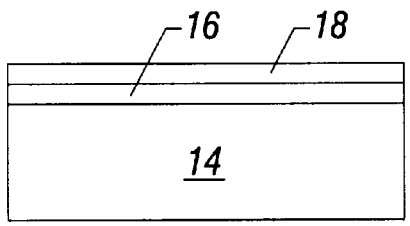
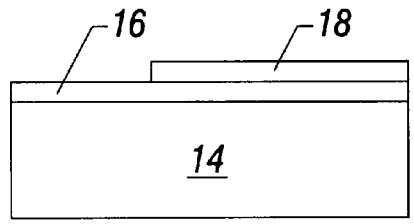
FIG. 3  FIG. 4
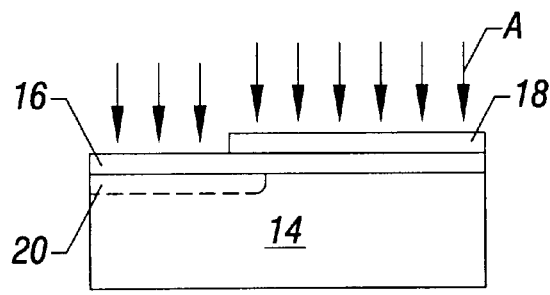
FIG. 5

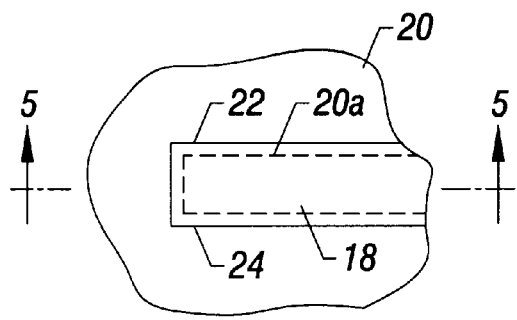 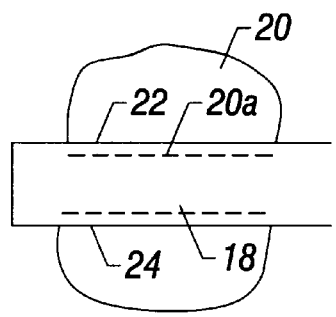
FIG. 6  FIG. 6a
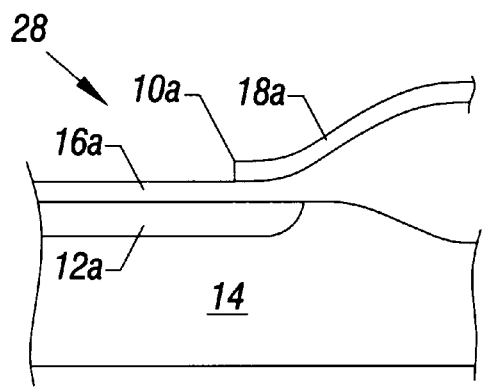
FIG. 7
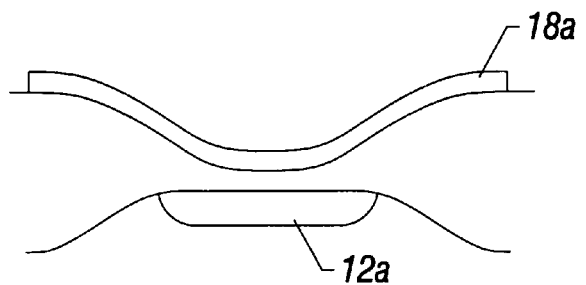
FIG. 7a

INTEGRATED CIRCUIT CAPACITOR

BACKGROUND

This invention relates generally to integrated circuit capacitors and methods for making the same and particularly to the variety of devices that include integrated circuit capacitors such as memory cells, logic devices and other semiconductor microelectronic devices.

It is very important in the formation of semiconductor devices to form high quality capacitors. A capacitor basically includes a conductive layer separated from a substrate by a dielectric layer.

In many cases, semiconductor capacitors provide critical functions. For example, in connection with memory devices, a capacitor may be used to erase a floating gate. A floating gate is a conductive layer which may be injected with charge to define a memory state. When it is desired to erase a cell which contains charge, the charge must be induced to flow from the floating gate through a dielectric into a substrate. Particularly in these and other situations where thin dielectrics are utilized, the integrity of the dielectric may be important to the operating characteristics of the resulting device.

Conventional capacitors are made by implanting a substrate with a conductivity type determining impurity. A dielectric layer is then grown over the implanted substrate and a conductive layer is patterned and formed over the dielectric layer. Thus, the dielectric layer may be formed over a substrate which is highly damaged because of ion implantation effects. This may mean that the resulting oxide layer and the adjacent surface of the substrate may be adversely affected by the implant damage. This may adversely affect the operation of the resulting capacitor.

Thus, there is a continuing need for integrated circuit capacitors which have improved quality and characteristics and particularly to those that are useful with relatively thin dielectric layers.

SUMMARY

In accordance with one aspect, a method of making an integrated circuit capacitor includes forming a dielectric layer on a semiconductor structure. A conductive layer is formed over the dielectric layer. The conductive layer is then used as a mask to cause conductivity-type determining impurities to enter the structure. The impurities are driven under the conductive layer.

BRIEF DESCRIPTION OF THE DRAWINGS

FIG. 1 is a greatly enlarged, partial top plan view of an integrated circuit capacitor in accordance with one embodiment;

FIG. 2 is a cross-sectional view taken generally along the line 2—2 in FIG. 1;

FIG. 3 shows a stage in the formation of the structure shown in FIG. 2;

FIG. 4 shows another stage in the formation of the structure shown in FIG. 2;

FIG. 5 is a cross-section taken generally along the line 5—5 in FIG. 6;

FIG. 6 is a top plan view corresponding to the structure shown in FIG. 5;

FIG. 6a is a top plan view of another embodiment;

FIG. 7 is a cross-section of another embodiment of the type shown in FIG. 6; and FIG. 7a is a cross-section of still another embodiment of the type shown in FIG. 6a.

DETAILED DESCRIPTION

An integrated circuit capacitor 10, shown in FIG. 1, may be formed on a semiconductor structure 10. The structure 10 may be made of any semiconductor material including silicon. A conductive layer 18 formed over the structure 10 acts as one plate of the capacitor 10. A dielectric 16 separates the conductive layer from the semiconductor structure 14. The dielectric layer may be formed, for example, of oxide.

While the layer 18 is illustrated as being finger shaped, it also could be in any variety of conventional shapes including a U-shape. It could also be formed along the length of a conductive line.

Another plate of the capacitor 10 may be created by the junction 12, shown in FIG. 2, formed within the structure 14. It may be formed by conductivity-type determining impurities which typically are n-type impurities. The concentration, species and depth of the junction may be chosen in accordance with conventional criteria.

Referring to FIG. 3, the formation of the capacitor 10 begins by forming the dielectric layer 16 over the structure 14. The layer 16 may be formed by thermal techniques or by deposition. That is, oxide can be formed, for example, by thermal growth, deposition, such as vapor deposition, or by combinations of well known techniques.

After the formation of the layer 16, the conductive layer 18 may be formed, for example, by deposition techniques. The conductive layer 18 may be made, for example, of polysilicon or metal, including metal silicides. As shown in FIG. 4, the layer 18 may be patterned to form the desire shape for the capacitor plate. Thereafter, conductivity-type determining impurities may be caused to enter the structure 14, as indicated by the arrows A in FIG. 5. This step may be accomplished using ion implantation, for example. Generally, high dose, high energy implantation is advantageous. Angled implants, to increase the implant scattering under the layer 18, are also advantageous. Typically implant angles of 7° to 48° are utilized. As a result, an implanted region 20 is formed which includes an extension 20a under the conductive layer 18, as shown in FIGS. 5, 6 (finger capacitor) and 6a (poly line capacitor).

The implanted impurity profile is then driven using thermal annealing processes. In particular, the impurities may be caused to diffuse inwardly under the layer 18 from each opposed edge 22, 24. The term "opposed" merely refers to the spacing between the edges. Eventually, the two impurity profiles converge, overlap and thereby bridge to form a junction underneath the conductive layer, as shown in FIG. 2. In this way, the metallurgical junction may extend completely across the layer 18 from edge 22 to edge 24.

The capacitor 10 may be any conventional capacitor. For example, it could be the erase capacitor of an electrically erasable, electrically programmable read only memory (EEPROM) or a flash memory. It could also be part of a dynamic random access memory (DRAM). The structures and techniques described herein may be particularly advantageous with small scale devices having small feature sizes. Particularly where reliability is important, the techniques and structures described herein are advantageous.

Because the junction underneath the conductive layer is formed entirely by diffusion, substantially no implant damage, such as knock-on effects, are present in the unction underneath the conductive layer. Therefore, the capacitor that results is of very high quality. Of course, light implants, such as threshold adjust implants may have been completed prior to the formation of the capacitor. These implants do not substantially damage the junction. A heavy implant is one with a dose of about $2 \times 10^{13}$ atoms per square centimeter or greater. Generally, heavy implants (as opposed to light implants) cause damage to the semiconductor, which may adversely affect the capacitor's reliability.

A capacitor which may be the tunnel capacitor for a semiconductor memory 28, shown in FIG. 7 and 28' FIG. 7a, includes a floating gate 18a, a dielectric 16a, a junction 12a and a semiconductor substrate 14. A field oxide 26 defines the size of the erase capacitor 10a. The use of the techniques described herein may be advantageous since it may improve the reliability of the erase or tunneling capacitor. In addition, embodiments may be advantageous in that the need for a tunnel window maybe eliminated.

While the present invention has been described with respect to a limited number of preferred embodiments, those skilled in the art will appreciate numerous modifications and variations therefrom. It is intended that the appended claims over all such modifications and variations as fall within the true spirit and scope of the present invention.

What is claimed is:

1. A method of making an integrated circuit capacitor comprising:

forming a dielectric on a semiconductor structure;

forming a conductive layer over the dielectric;

using the conductive layer as a mask, causing conductivity-type determining impurities to enter the structure; driving the impurities under the conductive layer; and causing impurities to extend under the conductive layer on two opposed sides and overlap one another.

2. The method of claim 1 including forming a dielectric layer by growing an oxide.

3. The method of claim 1 including patterning the conductive layer.

4. The method of claim 1 including ion implanting conductivity-type determining impurities.

5. A method of forming a capacitor comprising:

forming a dielectric over a semiconductor structure;

forming a conductive layer over the dielectric;

implanting impurities into the structure using the conductive layer as a mask;

driving the impurities under the conductive layer from each of two generally opposed edges; and forming a junction under the conductive layer by causing impurities driven under each of the edges to overlap.

6. The method of claim 5 including forming a dielectric by growing an oxide.

7. The method of claim 5 including patterning the conductive layer.

* * * * *

UNITED STATES PATENT AND TRADEMARK OFFICE
CERTIFICATE OF CORRECTION

PATENT NO. : 6,057,203
DATED : May 2, 2000
INVENTOR(S) : TING-WAH WONG

It is certified that error appears in the above-identified patent and that said Letters Patent is hereby corrected as shown below:

In column 4, line 5, after "structure;" but before "driving" begin a new paragraph.

Signed and Sealed this

Twenty-seventh Day of February, 2001

Attest:

NICHOLAS P. GODICI

Attesting Officer

Acting Director of the United States Patent and Trademark Office